(12) United States Patent
Kim et al.

(10) Patent No.: US 7,855,149 B2
(45) Date of Patent: Dec. 21, 2010

(54) TREATMENT METHOD FOR SURFACE OF SUBSTRATE, METHOD OF FABRICATING IMAGE SENSOR BY USING THE TREATMENT METHOD, AND IMAGE SENSOR FABRICATED BY THE SAME

(75) Inventors: Gi-Bum Kim, Yongin-si (KR); Hyun-Pil Noh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/320,097

(22) Filed: Jan. 16, 2009

(65) Prior Publication Data

US 2009/0197365 A1    Aug. 6, 2009

(30) Foreign Application Priority Data

Jan. 16, 2008    (KR) ...................... 10-2008-0005079

(51) Int. Cl.
*H01L 21/311* (2006.01)
(52) U.S. Cl. ...................... 438/700; 438/455; 438/689; 438/704; 438/724; 438/770; 257/E21.548; 257/E21.568
(58) Field of Classification Search ................. 438/402, 438/515
See application file for complete search history.

(56) References Cited

U.S. PATENT DOCUMENTS

2002/0062841 A1*    5/2002    Twu et al. ...................... 134/3

FOREIGN PATENT DOCUMENTS

| JP | 2003-31785 | 1/2003 |
|----|------------|--------|
| JP | 2003-338615 | 11/2003 |
| JP | 2006-19360 | 1/2006 |

* cited by examiner

*Primary Examiner*—N Drew Richards
*Assistant Examiner*—Kyoung Lee
(74) *Attorney, Agent, or Firm*—Harness, Dickey & Pierce, P.L.C.

(57) ABSTRACT

Provided may be a treatment method to remove defects created on the surface of a substrate, a method of fabricating an image sensor by using the treatment method, and an image sensor fabricated by the same. The treatment method may include providing a semiconductor substrate including a surface defect, providing a chemical solution to a surface of the semiconductor substrate, and removing the surface defect by consuming the surface of the semiconductor substrate and forming a chemical oxide layer on the semiconductor substrate.

15 Claims, 10 Drawing Sheets

TREATMENT METHOD FOR SURFACE OF SUBSTRATE, METHOD OF FABRICATING IMAGE SENSOR BY USING THE TREATMENT METHOD, AND IMAGE SENSOR FABRICATED BY THE SAME

PRIORITY STATEMENT

This application claims priority under U.S.C. §119 to Korean Patent Application No. 10-2008-0005079, filed on Jan. 16, 2008, in the Korean Intellectual Property Office (KIPO), the entire contents of which are incorporated herein by reference.

BACKGROUND

1. Field

Example embodiments relate to a substrate surface treatment method, a method of fabricating image sensor by using the treatment method, and an image sensor fabricated by the same. Other example embodiments relate to a substrate surface treatment method to improve low illuminance characteristics of an image sensor by removing defects on the surface of a substrate, a method of fabricating image sensor by using the treatment method, and an image sensor fabricated by the same.

2. Description of the Related Art

In general, an image sensor may be a semiconductor device that transforms photonic images into electrical signals. Such image sensors may be divided into two categories: CCDs (Charge Coupled Devices) and CMOS Image Sensors. A charge coupled device may be a device that includes MOS capacitors close to each other, and in such a device, electric charge carriers may be stored in the capacitors and may be transferred. A CMOS image sensor may be a device that includes a control circuit and a signal-processing circuit as a surrounding circuit implemented in CMOS technology. In such a device, the same amount of transistors as pixels may be formed, and the outputs may be sequentially extracted using a switching mechanism.

A CMOS image sensor may be divided into two regions: an APS (Active Pixel Sensor) array region that generates electrical signals by detecting light and a logic region (surrounding logic region) that processes electrical signals generated by the APS array region. The APS array region may include a photoelectric transformation unit that transforms incident lights into electrical signals. The greater the area of the photoelectric transformation unit, e.g., a photo diode, the better the photosensitivity characteristic of the image sensor. Although the integration density of a CMOS image sensor may be increased, increasing the size of the active pixel sensor array region has shown limitations.

SUMMARY

Example embodiments provide a substrate surface treatment method to remove defects created on the surface of the substrate. Example embodiments provide a method of fabricating an image sensor that may improve low illumination characteristics using the substrate surface treatment method above. Example embodiments provide an image sensor fabricated using the methods above.

However, example embodiments may be not restricted to the one set forth herein. The above will become more apparent to one of ordinary skill in the art to which example embodiments pertain by referencing the detailed description of example embodiments given below.

According to example embodiments, a treatment method for a surface of a substrate may include providing a semiconductor substrate including a surface defect, providing a chemical solution to a surface of the semiconductor substrate, and removing the surface defect by consuming the surface of the semiconductor substrate and forming a chemical oxide layer on the semiconductor substrate.

According to example embodiments, a method of fabricating an image sensor may include providing a semiconductor substrate where a front side and a back side are defined, forming a photoelectric transformation unit adjacent to the front side of the semiconductor substrate, forming multiple interconnection layers on the front side of the semiconductor substrate, reducing a thickness of the semiconductor substrate by removing a part of the back side of the semiconductor substrate, performing the treatment method according to example embodiments, wherein the surface defect is a back side defect, the back side of the semiconductor substrate is consumed, and the chemical oxide layer is formed on the back side of the semiconductor substrate, and forming a color filter and a micro-lens on the back side of the semiconductor substrate to correspond to each of the phototransformation units.

According to example embodiments, an image sensor may include a semiconductor substrate including a defined front side and a back side, a plurality of photoelectric transformation units in the semiconductor substrate adjacent to the front side of the semiconductor substrate, multiple interconnection layers on the front side of the semiconductor substrate, a chemical oxide layer on the back side of the semiconductor substrate formed by consuming the semiconductor substrate with a chemical solution, and a color filter and a micro-lens on the chemical oxide layer corresponding to each of the plurality of phototransformation units.

Although a micro-lens that gathers light is used in an image sensor, light entering the micro-lens at an angle may not reach a photoelectric transformation unit. As a result, the quantity of light may be reduced and the photosensitivity of the image sensor may be lowered. Also, the quantity of light that arrives at the photoelectric transformation unit may be reduced due to the distance between the micro-lens and the photoelectric transformation unit, which decreases the photosensitivity of the image sensor.

Methods to prevent or reduce deterioration of photosensitivity of an image sensor may include a method that shortens the path of light entering a phototransformation unit by allowing light to enter from the back side of a semiconductor substrate. However, the method allowing light to enter from the back side of the semiconductor substrate may suffer disadvantages, e.g., low illumination, when the back side of the semiconductor substrate may be contaminated or may contain surface defects. When light enters the back side of the semiconductor substrate, electric charges or hole carriers may be created on the back side surface of the semiconductor substrate. As a result, the low illumination characteristic, e.g., a leak current, may increase on the back side of the semiconductor substrate, may deteriorate.

BRIEF DESCRIPTION OF THE DRAWINGS

Example embodiments will be more clearly understood from the following detailed description taken in conjunction with the accompanying drawings. FIGS. 1A-7 represent non-limiting, example embodiments as described herein.

FIGS. 1A-1D are sectional views sequentially illustrating a method of substrate surface treatment according to example embodiments;

FIG. 2 is a block diagram illustrating an image sensor according to example embodiments;

FIG. 3 is a simplified circuit diagram illustrating an APS of an image sensor according to example embodiments;

FIG. 4 is a circuit diagram illustrating a unit pixel of an image sensor according to example embodiments;

FIG. 5 is a schematic top view illustrating an active pixel sensor (APS) array of an image sensor according to example embodiments;

FIG. 6 is a sectional view illustrating an image sensor according to example embodiments;

FIG. 7 is a flow chart illustrating a method of fabricating an image sensor according to example embodiments;

Figure 1A:
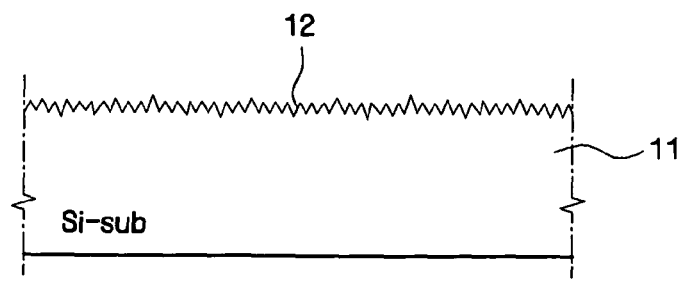

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Advantages and features of example embodiments and methods of accomplishing the same may be understood more readily by reference to the following detailed description of example embodiments and the accompanying drawings. Example embodiments may, however, be embodied in many different forms and should not be construed as being limited to the embodiments set forth herein. Rather, these embodiments may be provided so that this disclosure will be thorough and complete and will fully convey the concept of example embodiments to those skilled in the art, and example embodiments will only be defined by the appended claims. In the drawings, the thickness of layers and regions may be exaggerated for clarity.

It will be understood that when an element or layer is referred to as being "on" or extending "onto" another element, it can be directly on or extend directly onto the other element or intervening elements may also be present. In contrast, when an element is referred to as being "directly on" or extending "directly onto" another element, there are no intervening elements present. As used herein the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout the specification.

The terminology used herein is for the purpose of describing particular embodiments only and is not intended to be limiting of the example embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Referring to FIGS. 1A-1D, a method of substrate surface treatment according to example embodiments may be described in detail. FIGS. 1A-1D are sectional views sequentially illustrating a method of substrate surface treatment according to example embodiments. As illustrated in FIG. 1A, a silicon substrate 11 including fine defects 12 on a surface may be provided. Depending on the semiconductor processes performed, a structure (not shown) may be formed on the silicon substrate 11. The silicon substrate 11 used to fabricate semiconductor devices may be composed of a single crystal silicon layer and/or silicon epitaxial layer. The surface of the silicon substrate 11 may include surface defects 12 created by unit processes to fabricate semiconductor devices.

For example, an ion implantation process, or an anisotropic or isotropic etch process may be used to pattern the semiconductor substrate 11 and a thin film, and a polishing process may be performed on the semiconductor substrate 11 in order to introduce fine defects on the surface of the silicon substrate 11. Such fine defects 12 created on the surface of the silicon substrate 11 may create an impact on the subsequent processes, and as a result, the characteristics of a semiconductor device may be deteriorated. Thus, the surface defects 12 created on the silicon substrate 11 may be removed.

Figure 1B:
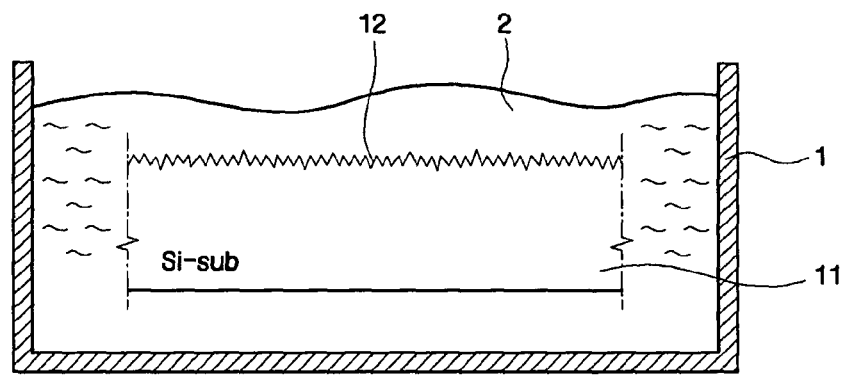

A chemical solution 2 for treating a surface and consuming silicon may be provided on the surface of the silicon substrate 11. For example, as illustrated in FIG. 1B, the silicon substrate 11 having the surface defects 12 may be dipped into a chemical bath 1 containing chemical solution 2 that may consume silicon at a relatively low temperature. The chemical solution 2 contained in the chemical bath 1 may be maintained at a lower temperature compared to a temperature used for other unit processes in order to minimize or reduce impacts on a structure in or on the semiconductor substrate 11. For example, the chemical solution 2 contained in the chemical bath 1 may be maintained at a temperature from about 80° C. to about 200° C.

Also, the chemical solution 2 may be a liquid that reacts to silicon atoms to remove the fine defects 12 created on the surface of the silicon substrate 11, and by reacting with silicon atoms, a chemical oxide ($SiO_2$) may be formed. The chemical solution 2 may include a mixed solution SC-1 of $NH_4OH$, $H_2O_2$, and $H_2O$, a mixed solution SC-2 of $HC_1$, $H_2O_2$, and $H_2O$, or a DI water solution in which $O_3$ may be dissolved (ozone water).

The silicon substrate 11 may be dipped into the chemical solution 2 for about 5 minutes to about 30 minutes. The dipping time may vary. However, as the dipping time increases, silicon oxide may be gradually formed on the surface of the silicon substrate 11 instead of silicon. As a result, chemical reactions between silicon and the chemical solution 2 may decrease, and the thickness of chemical oxide 14 may be saturated with a certain value. As a result, the chemical oxide 14 formed by reaction between the silicon substrate 11 and the chemical solution for surface treatment 2 may be formed at a thickness of about 1 mm to about 10 mm.

Figure 1C:
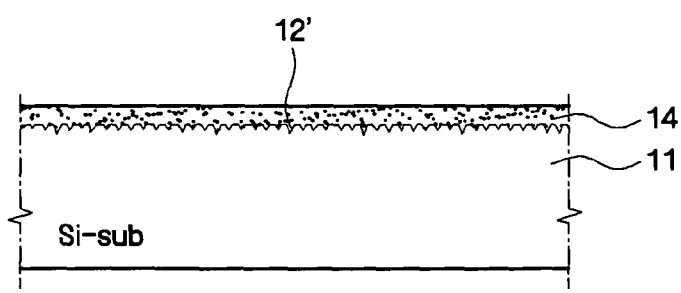
Figure 1D:
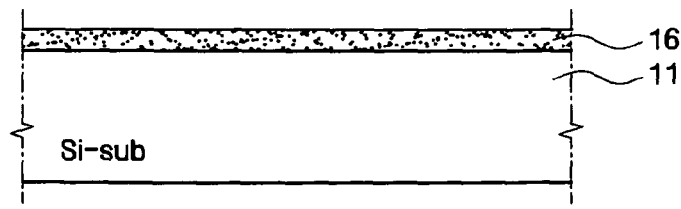

As described above, by performing a treatment with the chemical solution 2 on the surface of the silicon substrate 11, fine defects 12 on the surface of the silicon substrate 11 may be removed. The thickness of the silicon substrate 11 consumed by the treatment of the chemical solution 2 may be several nm or less. Thus, as illustrated in FIG. 1C, one chemical solution treatment may not guarantee removal of all defects 12' created on the surface of the silicon substrate 11. Therefore, the chemical oxide 14 formed on the surface of the silicon substrate 11 may be removed, and then, the silicon substrate 11 may be dipped into the chemical solution 2 again. As a result, the chemical oxide 16 may be reformed by consuming the surface of the silicon substrate 11. In example embodiments, the chemical oxide 14 may be more easily removed by using HF solution.

By performing such processes repeatedly, for example, about two or three times, the defective surface of the silicon substrate 11 may be consumed and a higher quality surface of the silicon substrate 11 may be obtained. Thus, a silicon substrate 11 having a high quality surface layer may be obtained, and at the same time the chemical oxide 16, which may be a relatively fine thin film of several nm, may be formed on the surface of the silicon substrate 11. Therefore, after surface treatment of the silicon substrate 11, another layer may be formed on the silicon substrate 11 to perform semiconductor device fabrication processes. As a result, the electrical characteristics of a semiconductor device may be improved. Where a silicon oxide may be required after surface treatment of the silicon substrate 11, the chemical oxide 16 formed after a last dipping of the silicon substrate 11 may not be removed, and may be used for semiconductor device fabrication. Also, where the surface defect of the silicon substrate 11 needs to be removed completely, the following method may be used.

The thickness of the silicon substrate with surface defects and the thickness of the defective surface may be measured. The silicon substrate with surface defects may be dipped into the chemical solution for surface treatment. As a result, the surface of the silicon substrate may be consumed and a chemical oxide may be formed on the surface of the silicon substrate. The thickness of the silicon substrate may be measured and compared to the thickness of the silicon substrate before the chemical solution treatment. Based on the comparison, surface defects of the silicon substrate may be completely removed. If the thickness of the substrate after the chemical solution treatment is greater than the thickness of a non-defect silicon substrate without the defective surface, chemical oxide removal and chemical solution dipping may be repeatedly performed. Using methods described above, the surface defects of the silicon substrate may be completely removed and a high-quality surface silicon substrate may be obtained.

As described above, according to the substrate treatment method based on example embodiments, because surface defects created on the surface of the silicon substrate may be removed using a chemical solution that may consume silicon at a relatively low temperature, surface defects of the silicon substrate may be removed while minimizing or reducing impacts on the structures formed on other areas in the silicon substrate. Hereinafter, an image sensor and a method of fabricating the same according to example embodiments may be described in detail. In example embodiments described below, a CMOS image sensor may be used as an example of an image sensor. However, the technical concepts of the example embodiments may also be applied without modification to a Charge Coupled Device CCD.

Figure 2:
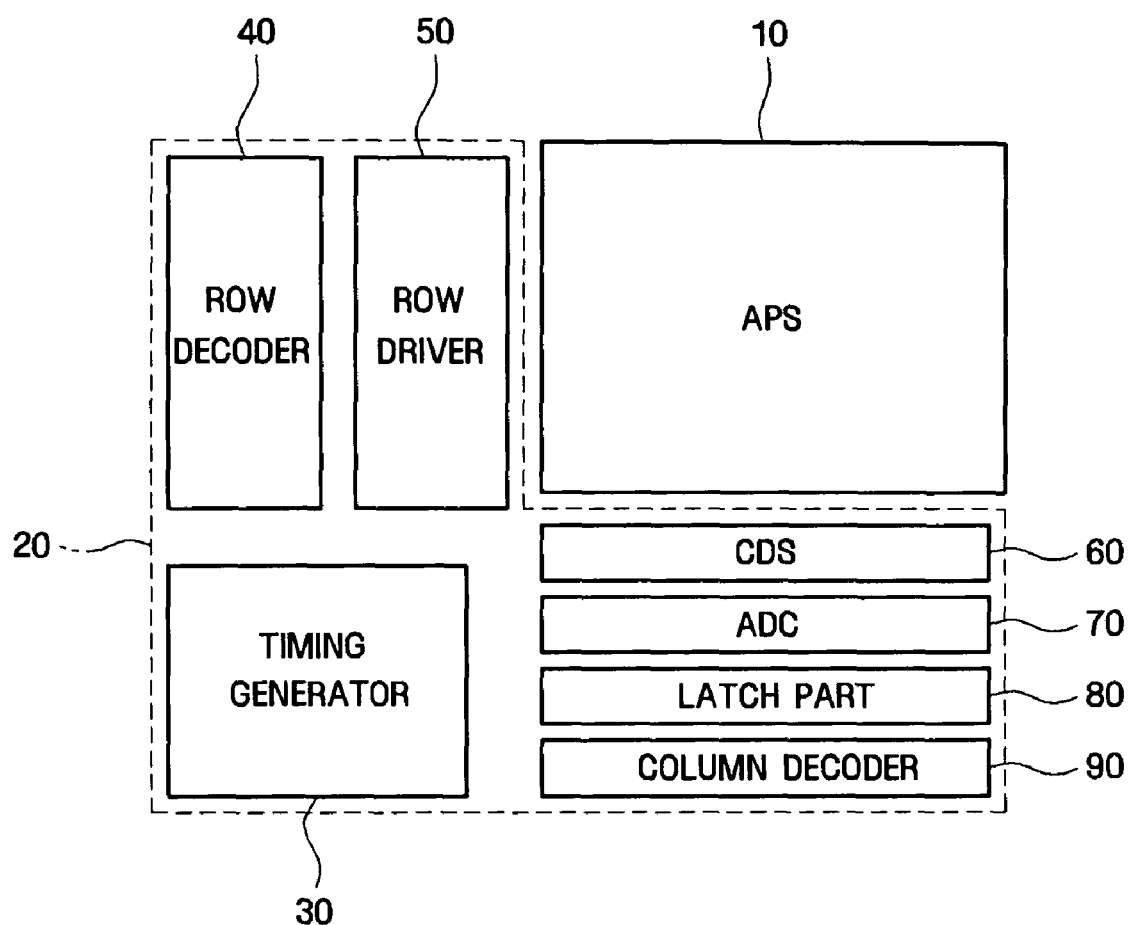
Figure 3:
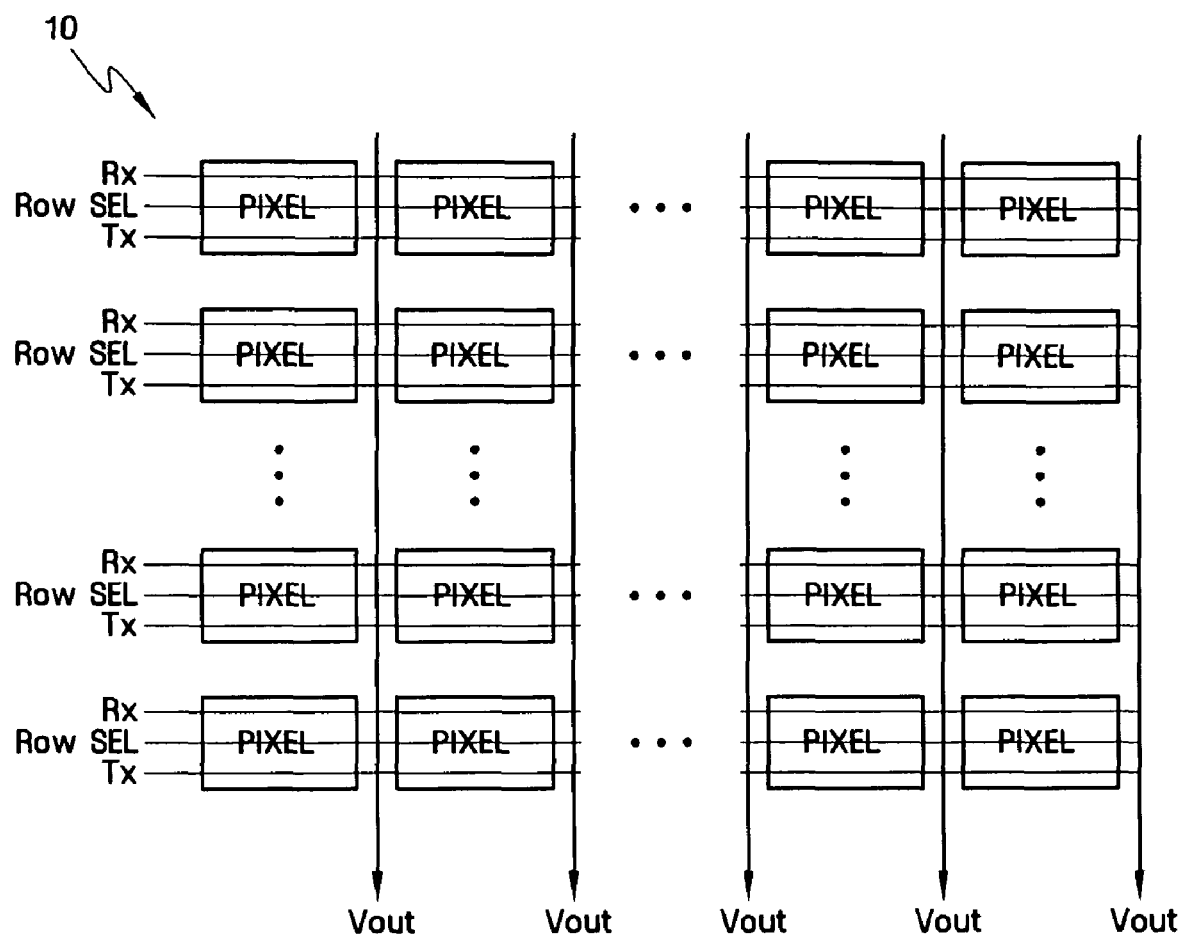

Referring to FIGS. 2-6, a structure of a CMOS image sensor according to example embodiments is described in detail. FIG. 2 is a block diagram illustrating an image sensor according to example embodiments. FIG. 3 is a simplified circuit diagram illustrating an APS of an image sensor according to example embodiments. Referring to FIG. 2, an image sensor may include an active pixel sensor APS array region 10 which may be constructed by two dimensional arrays of pixels including light receiving devices and a logic region 20 to operate the APS array region 10.

The APS array region 10 may include multiple unit pixels arranged in two dimensions, and may be composed of unit pixels 100 having the equivalent circuit diagram shown in FIG. 3 arranged in a matrix fashion. Referring back to FIG. 2, the APS array region 10 may convert light signals into electrical signals and may be operated by multiple driving signals including a pixel selection signal SEL, a reset signal RX, and a charge transmission signal TX provided by a row driver 50. Also, the converted electrical signals may be delivered to a correlated double sampler CDS 60 through vertical signal lines.

The logic region 20 may include a timing generator 30, a row decoder 40, a row driver 50, the CDS 60, an analog to digital converter ADC 70, a latch 80, and a column decoder 90. The timing generator 30 may provide the row decoder 40 and the column decoder 90 with timing and control signals. The row driver 50 may provide the APS array region 10 with multiple driving signals to drive multiple unit pixels based on decoding result from the row decoder 40. In general, if the unit pixels are arranged in a matrix fashion, the driving signals may be provided for each row.

The correlated double sampler 60 may receive electrical signals generated in the APS array region 10 through vertical signal lines and may perform hold and sample operations. In example embodiments, the correlated double sampler 60 may double-sample a noise level and a signal level of an electrical signal and may output a differential level between the noise level and the signal level. The analog-to-digital converter 70 may convert analog signals corresponding to a level of signal difference to digital signals and may output the digital signals. The latch 80 may latch digital signals and the latched signals may be sequentially sent to an image signal processing unit (not shown) according to decoding results from the column decoder 90.

Figure 4:
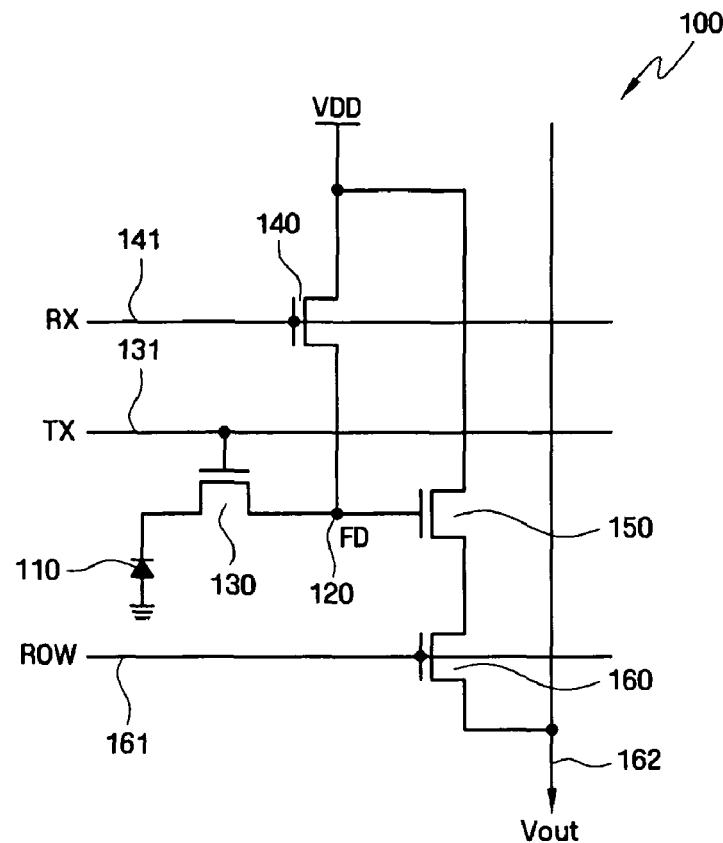

FIG. 4 is a circuit diagram illustrating a unit pixel of an image sensor according to example embodiments. Although FIG. 4 illustrates a case where a unit pixel region 100 may be composed of a structure with four transistors, the unit pixel region 100 may be also composed of a three transistor structure, a five transistor structure, or a photo gate structure similar to the four transistor structure. Referring to FIG. 4, each unit pixel region 100 composed of a four transistor structure may be divided into a light-receiving element 110 that receives light to generate and accumulate photon charges and a read device to extract photon signals induced into the light-receiving element 110. The read device may include a reset device 140, a driving device 150, and a selection device 160. In example embodiments, the light-receiving element 110 may generate and accumulate electric charge corresponding to the incident light, and may include a photo diode, a photo transistor, a photo gate, a pinned photo diode (PPD), and combinations of these elements. Also, the light-receiving element 110 may be connected to a charge transmission device 130 which transfers the accumulated photo charges to a floating diffusion region (FD) 120.

The floating diffusion region 120 may receive charges accumulated in the light-receiving element 110. Because the floating diffusion region 120 has a parasitic capacitance, charges may be cumulatively stored. Also, the floating diffusion region 120 may be electrically connected to the driving device 150, and may control the driving device 150. The charge transmission device 130 may transmit charges from the light-receiving element 110 to the floating diffusion region 120. The charge transmission device 130 may be typically composed of one transistor, and may be controlled by a charge transmission signal TX. The reset device 140 may periodically reset the floating diffusion region 120. A source of the reset device 140 may be connected to the floating diffusion region 120, and a drain may be connected to voltage Vdd. The reset device 140 may be driven by a bias provided by a reset line 141. Thus, when the reset device 140 is turned on by the bias provided by the reset line 141, the source voltage Vdd connected to the drain of the reset device 140 may be delivered to the floating diffusion region 120.

The driving device 150 may be combined with a current source (not shown) located outside of the unit pixel region 100, and may serve as a source follower buffer amplifier which amplifies electrical potential change of the floating diffusion region 120, receives the photon charges accumulated in the light-receiving element 110, and outputs amplification through an output line 162. The selection device 160 may select the unit pixel 100 to be read out per row. The selection device 160 may be driven by a bias provided by a row selection line ROW. When the selection device 160 is turned on, the source voltage Vdd connected to a drain of the selection device 160 may be delivered to a drain of the driving device 150. Also, driving signal lines 131, 141, 161 of the charge transmission device 130, the reset device 140, and the selection device 160 may be extended in a row direction (horizontal direction) to drive the unit pixel 100 included in the same row simultaneously.

Figure 5:
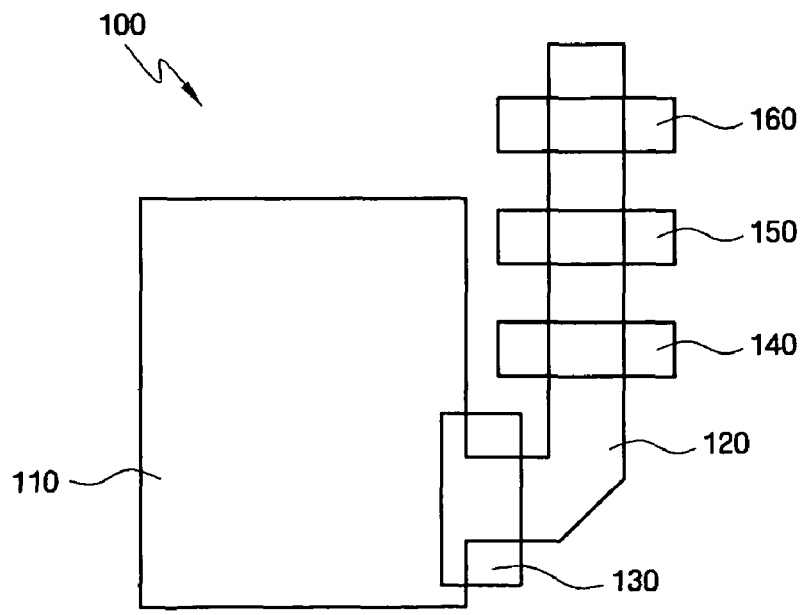

FIG. 5 is a schematic top view illustrating an active pixel sensor (APS) array an image sensor according to example embodiments. Referring to FIG. 5, because the APS array region (refer to 10 in FIGS. 1 and 2) has the unit pixels arranged in a matrix shape, the substrate may be divided into the rectangular-shaped unit pixel regions 100. The light-receiving element 110 may be located in the center of each unit pixel region 100, and the floating diffusion region 120, the charge transmission device 130, the reset device 140, the driving device 150, and the selection device 160 may be located in each of the unit pixel regions 100 of the surrounding area of the light-receiving element 110. The shape of an active region of such APS array may vary depending on the design rule of an image sensor.

Figure 6:
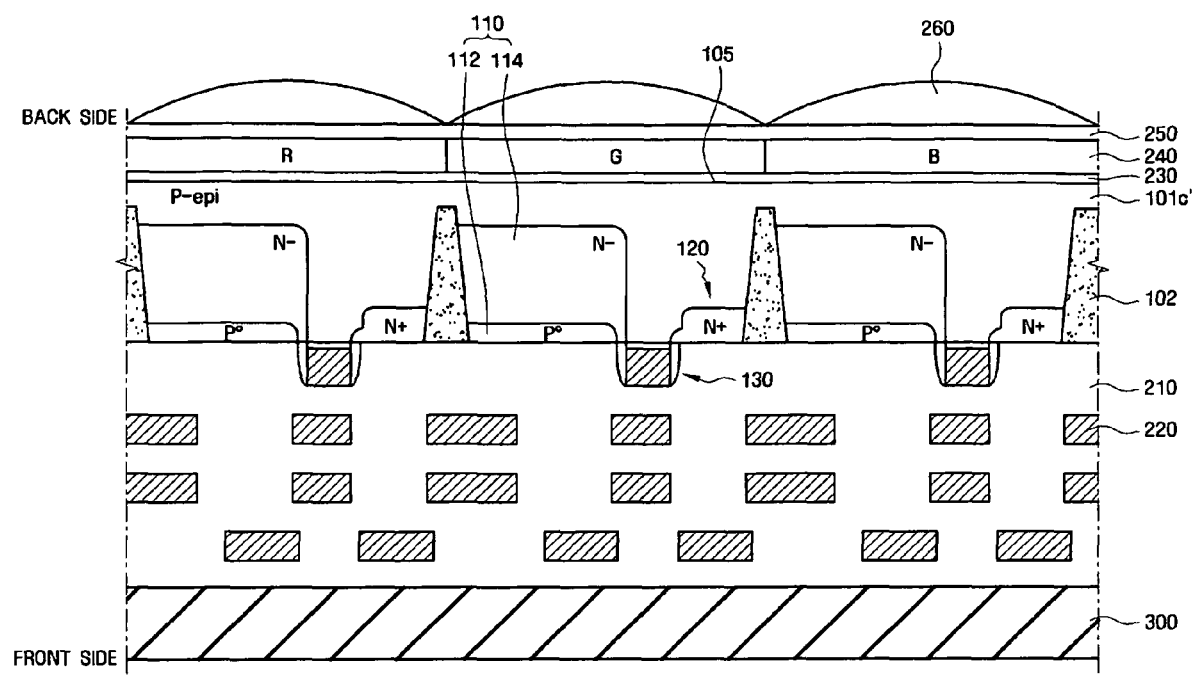

Referring to FIG. 6, the sectional structure of an image sensor may be described in detail. FIG. 6 is a sectional view of an image sensor according to example embodiments illustrating a sectional view of APS array region with dense unit pixels. Referring to FIG. 6, the image sensor according to example embodiments may include a back side illuminated image sensor which receives light from the back side of the semiconductor substrate 101c'. A front side and a back side of a semiconductor substrate may indicate a relative direction or a location relationship, rather than an absolute direction. However, to aid in understanding of the following example embodiments, the term "the frontside of a semiconductor substrate" may be defined as the starting direction or location for fabrication processes of the semiconductor substrate for an image sensor, and the term "the backside of the a semiconductor substrate" may be defined as the reverse direction or location corresponding to the frontside of the semiconductor substrate.

On the front side of a semiconductor substrate 101c', devices that transmit and read light signals may be formed, and on the back side of the semiconductor substrate 101c', light penetration devices that allow light penetration and light to enter the light-receiving element 110 may be formed. On the front side of the semiconductor substrate 101c', a charge transmission device 130, a reset device (refer to 140 in FIG. 5), a driving device (refer to 150 in FIG. 5), the selection device (refer to 160 in FIG. 5), and interconnection layers 220 may be formed. On the back side of the semiconductor substrate 101c' a color filter layer 240 and a micro-lens 260 may be formed. In example embodiments, for the first semiconductor substrate, the substrate having the P-type epitaxial layer 101c' formed on a P-type bulk silicon substrate may be used, and also, the semiconductor substrate having only the P-type epitaxial layer 101c' after removing the bulk silicon substrate during fabrication processes may be used. Such semiconductor substrates may include separate well regions. In the structure of an image sensor according to example embodiments, the semiconductor substrate may be referred to as the P-type epitaxial layer 101c'. However, example embodiments are not limited to such, and various types of semiconductor substrates including the bulk silicon substrate may be used.

In the semiconductor substrate 101c', an active region may be defined by a device isolation layer 102. For example, the device isolation layer 102 may be composed of STI (Shallow Trench Isolation) which is formed from the front side to an inside of the semiconductor substrate 101c' or FOX (Field OXide) using a LOCOS (LOCal Oxidation of Silicon) method. On the front side of the semiconductor substrate 101c', multiple transistors may be placed. In example embodiments, on the front side of the semiconductor substrate 101c', the transfer gate 130, the reset gate (refer to 140 in FIG. 5), the driving gate (refer to 150 in FIG. 5), and a selection gate (refer to 160 in FIG. 5) may be placed. The light-receiving element 110 may be located on one side of the transfer gate 130. According to example embodiments, a pinned photodiode may be formed as the light-receiving element 110.

In example embodiments, the pinned photo diode 110 may include an N-type photodiode 112 and a P-type photodiode 114 which are formed by two ion implantations. The N-type photodiode 112 may be formed deep inside the P-type epitaxial layer 101c', and the P-type photodiode 114 may be shallowly formed on the N-type photodiode 112. As a result, the pinned photodiode 110 may include a PNP junction structure including a stack of a semiconductor substrate 101c' including the P-type epitaxial layer 101c', the N-type photodiode 112, and the P-type photodiode 114.

The N-type photodiode 112 may absorb incident light and may accumulate photocharges, and the P-type photodiode 114 may prevent or reduce dark current by reducing electron-hole pairs (EHP). Dark current may be generated by surface damage of a semiconductor substrate 101 including silicon dangling bonds and etching stress. Thus, among the EHPs generated by heat on the surface, holes may be diffused into the substrate 101 connected to the ground via the P-type photodiode 114, and electrons may be consumed by recombination with holes during the P-type photodiode 114 diffusion.

In the semiconductor substrate 101c' which is located on the other side of the transfer gate 130, a floating diffusion region 120, which may be separated from the pinned photodiode 110 and formed by implanting N-type impurities, may be located. The floating diffusion region 120 may receive photon charges accumulated in the pinned photodiode 110 through the transfer gate 130. The floating diffusion region 120 may be composed of a low density or a high density impurity region. The floating diffusion region 120 may have a LDD (Lightly Doped Drain) structure or a DDD (Double Doped Drain) structure.

As described above, the transfer gate 130 located on the substrate 101c' between the pinned photodiode 110 and the floating diffusion region 120 may transfer photon charges accumulated in the pinned photodiode 110 to the floating diffusion region 120. As described above, on the front side of the semiconductor substrate 101c' where devices to transfer or read photon signals are formed, an interlayer dielectric layer 210 covering the front side of the semiconductor substrate 101c' may be formed. A top of the interlayer dielectric layer 210 may be planarized. The interlayer dielectric layer 210 may be formed in multiple layers on the front side of the semiconductor substrate 101c', and the metal interconnection layers 220 may be formed in the multiple interlayer dielectric layers 210. On the top interlayer dielectric layer 210, a silicon support layer 300 may be formed. In addition, the P-type epitaxial layer 101c' with an increased quality surface layer 105 may be obtained.

On the back side of the semiconductor substrate 101c' where the light-receiving element 110 may be formed, a silicon oxide layer 230 may be located. The silicon oxide layer 230 may be a chemical oxide layer formed by performing the surface treatment using the chemical solution which consumes silicon at a lower temperature. Hereinafter, descriptions using an example chemical oxide 230 may be silicon oxide. The surface of the back side of the semiconductor substrate 101c' may be treated by the chemical solution to prevent or reduce low illumination noise, e.g., dark current, caused by the surface defects of the semiconductor substrate 101c' during light penetration into the light-receiving element 110.

To fabricate a back side illuminated image sensor and to reduce the thickness of the semiconductor substrate 101c' portion, the back side of the semiconductor substrate 101c' may be removed. In example embodiments, surface defects caused by etching stress or silicon dangling defects may be created. Thus, by performing a surface treatment using a chemical solution to consume silicon at a relatively low temperature, defects created on the back side surface of the semiconductor substrate 101c' may be removed. As a result, depletion well created due to an electrical potential drop on the back side caused by the surface defects of the semiconductor substrate 101c' may be removed. Also, because thermoelectron generation and interface traps on the surface of the semiconductor substrate 101c' may be prevented or reduced, low illumination noise of an image sensor may be prevented or reduced, and photosensitivity may be improved.

Thus, the back side of the semiconductor substrate 101c' may have a uniform quality, and the chemical oxide layer 230 formed during surface treatment may be located on the surface-treated back side. The chemical oxide layer 230 may be formed with an about 1 nm to about 10 nm fine layer. The chemical oxide layer 230 formed on the back side of the semiconductor substrate 101c' may act as an anti-reflection layer that may prevent or reduce the reduction of incident light due to the reflection of incident light entering from the back side.

The color filter layer 240 may be formed on the chemical oxide layer 230, which corresponds to each light-receiving element 110. The color filter layer 240 may be formed such that color filters may be arranged in a matrix shape similar to the light-receiving elements 110 arranged in a matrix fashion. To obtain higher quality images, the color filter layer 240 may allow light of a particular color to penetrate the color filter layer 240 and to arrive at the light-receiving element 110 of the semiconductor substrate 101c'. The color filter having red (R), green (G), and blue (B) arranged in a Bayer pattern may be used as such color filter layer 240.

A micro-lens 260 corresponding to each light-receiving element 110 may be located on top of the color filter layer 240. The micro-lens 260 may alternate a path of light entering into other areas than the photo receiving element 110 and may redirect light to the light-receiving element 110. Also, a planarization layer 250, which may be called an over-coating layer (OCL), may be formed between the color filter layer 240 and the micro-lens 260 and composed of thermosetting resin.

In such an image sensor, light may enter from the back side of the semiconductor substrate 101c' and the incident light may enter into the light-receiving element 110 through the micro-lens 260, the color filter layer 240, and the semiconductor substrate 101c'. Light entered into the micro-lens may suffer loss before arriving at the light-receiving element 110, and because the distance between the micro-lens 260 and the light-receiving element 110 may be shorter, the loss may be reduced. Also, because the back side defects of the semiconductor substrate 101c' are removed by a surface treatment using a chemical solution, noise caused by the back side defects may be prevented or reduced, when light penetrates the micro-lens 260 and the color filter 240 enters the semiconductor substrate 101c'.

Figure 7:
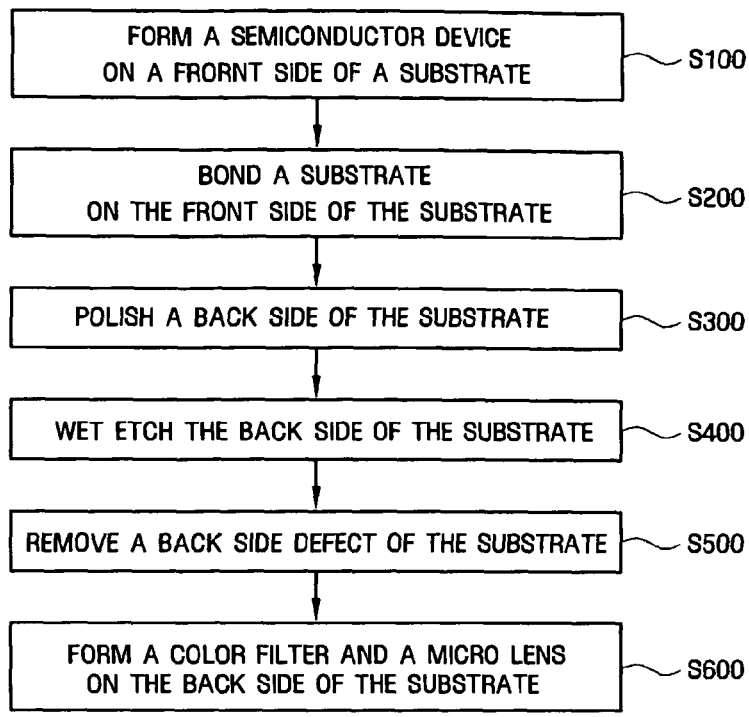
Figure 8:
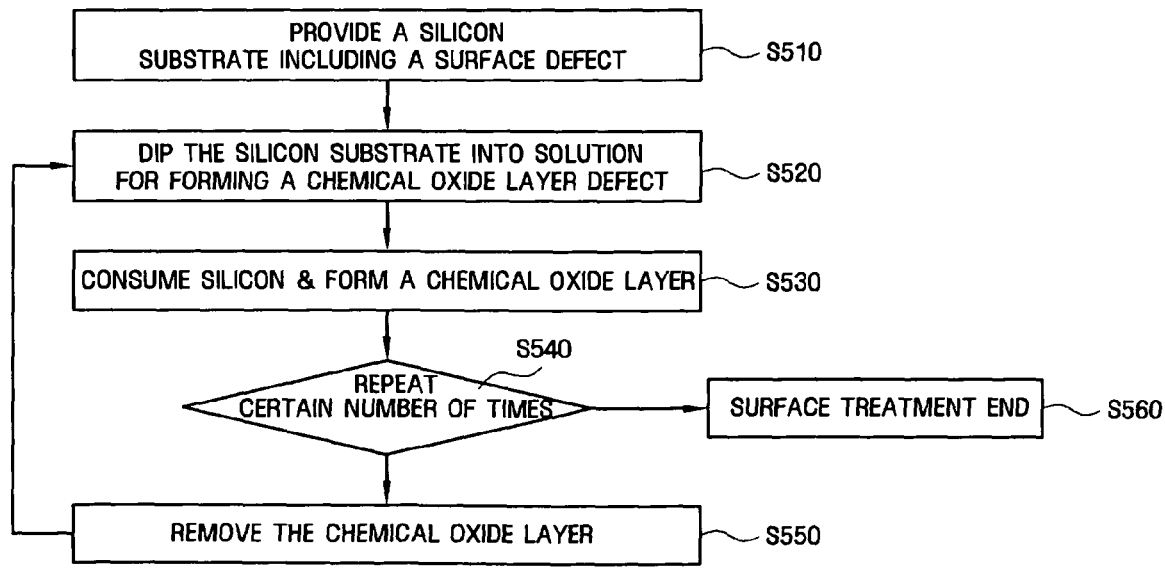
FIG. 8 is a flow chart illustrating a treatment method for substrate surface of fabricating method of an image sensor according to example embodiments.
Figure 9:
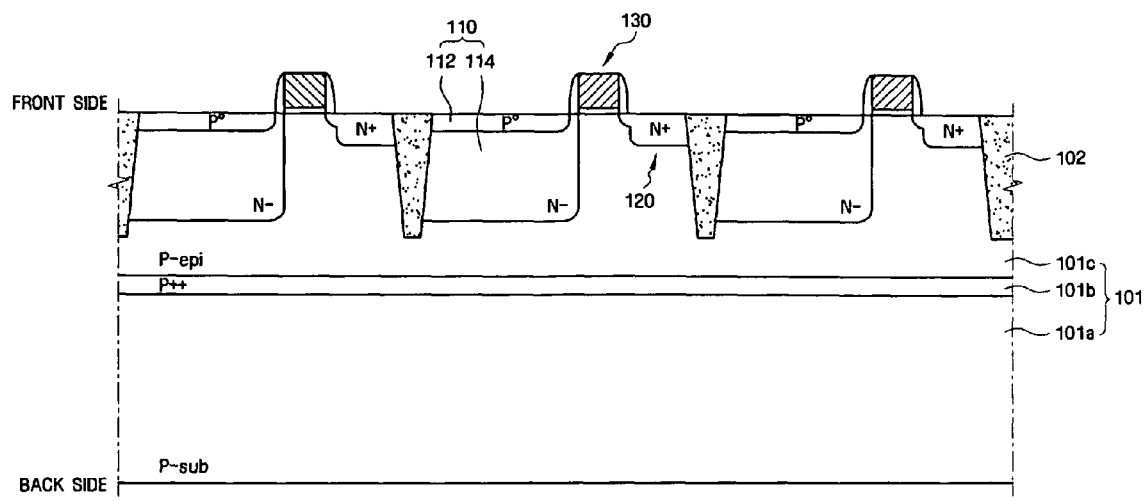
FIGS. 9-15 are sectional views sequentially illustrating a method of fabricating an image sensor according to example embodiments.

Referring to FIGS. 7-15, a method of fabricating an image sensor according to example embodiments is described in detail. FIG. 7 is a flow chart illustrating a method of fabricating an image sensor according to example embodiments. FIG. 8 is a flow chart illustrating a treatment method for a substrate surface in the method of fabricating an image sensor according to example embodiments. FIGS. 9-15 are sectional views sequentially illustrating a method of fabricating an image sensor according to example embodiments.

Semiconductor devices, which transfer and read photon signals, may be formed on the front side of the semiconductor substrate 101 (S100). In more detailed descriptions using FIG. 9, a semiconductor substrate 101, whose front side and back side is defined, may be provided. The semiconductor substrate 101, where a P-type epitaxial layer 101c is formed on a P-type bulk substrate 101a, may be used as the semiconductor substrate 101. From the semiconductor substrate 101, a direction of the P-type epitaxial layer 101c may be defined as a front side, and a direction of the P-type bulk substrate 101a may be defined as a back side. A P-type deep well 101b may be formed by performing ion implantation using high density P-type impurities inside a P-type epitaxial layer 101c.

By performing a LOCOS (Local Oxidation of Silicon) process or an STI (Shallow Trench Isolation) process on the front side of the semiconductor substrate 101, a device isolation layer 102, which separates a field region from an active region, may be formed. Multiple transistors may be formed on the front side of the semiconductor substrate 101. In example embodiments, on the front side of the semiconductor substrate 101, a gate dielectric layer (not shown) and a gate conductive layer (not shown) may be sequentially formed. The stacked gate dielectric layer and the gate conductive layer may be patterned and multiple gates may be formed on the substrate 101. Thus, on the semiconductor substrate 101 gates for a charge transmission device 130, a reset device (refer 140 in FIG. 5), a driving device (refer 150 in FIG. 5), and a selection device (refer 160 in FIG. 5) may be formed.

In the semiconductor substrate 101 of one side of the transfer gate 130, a light-receiving element 110 may be formed. In example embodiments, the light-receiving element 110 may be formed inside the P-type epitaxial layer 101c, and the light-receiving element 110 may be formed with a pinned photodiode. In example embodiments, on the front side of the substrate 101, a first mask pattern (not shown) may be formed to expose the area where the pinned photodiode is to be formed. The N-type impurities may be ion implanted into the substrate 101 using the first mask pattern to form an N-type photodiode 112. When forming the N-type photodiode 112, the impurity ion implantation may be performed with a tilt of about 0° to about 15° to a direction of the transfer gate 130. As a result, the N-type photodiode 112 may be partially overlapped with the transfer gate 130.

After forming the N-type photodiode 112 by implanting P-type impurities using the first mask pattern (not shown) to form the N-type photodiode 112, a P-type photodiode 114 shallowly doped on the N-type photodiode 112 may be formed. When forming the P-type photodiode 114, the P-type impurity ion implantation may be performed with a tilt of the same or greater than about 0° to a direction of the device isolation layer 102. The P-type photodiode 114 may prevent or reduce dark current by reducing an electron-hole pair (EHP) generated by heat on the surface of a P-type epitaxial layer 101c. After forming the pinned photodiode 110 as described above, the first mask pattern used to form the pinned photodiode 110 may be removed. Although the pinned photodiode 110 may be formed after forming multiple gates 130, the order of formation may vary.

Spacers may be formed on both sides of the multiple gates 130. The spacer may be formed by an anisotropic etching after deposition of a dielectric layer for spacer conformally along with the surface of the substrate and the gates. In this step, where a floating diffusion region 120 having an LLD structure may be formed on the other side of the gates 130, a low density impurity region may be formed before forming the spacer.

After forming a second mask pattern (not shown) that covers the pinned photodiode 110, the floating diffusion region 120 may be formed in the semiconductor substrate 101 of both sides of the multiple gates. The floating diffusion region 120 may be formed by doping the N-type impurity which may be identical to the N-type photodiode 112. When forming the floating diffusion region 120 as described above, source/drain regions of the reset device (refer 140 in FIG. 5), the driving device (refer 150 in FIG. 5), and a selection device (refer 160 in FIG. 5) may be formed simultaneously. After forming the floating diffusion region 120, the second mask pattern used for the ion implantation may be removed.

Figure 10:
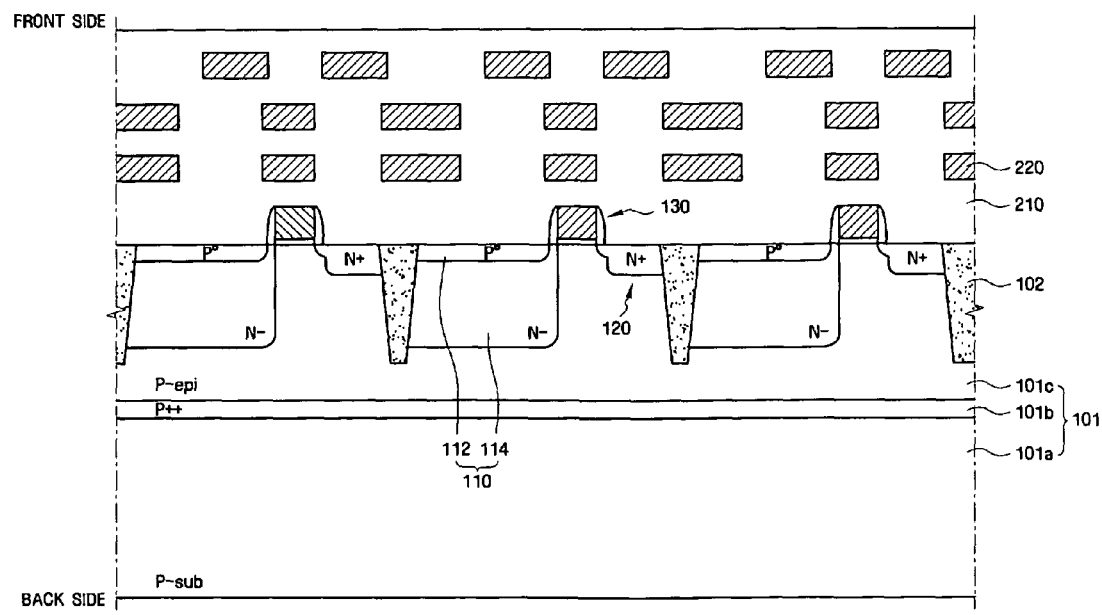

As a result, on the front side of the semiconductor substrate 101 an APS array (refer 10 in FIG. 2) including the light-receiving element 110, the floating diffusion region 120, the charge transmission device 130, the reset device (refer 140 in FIG. 5), the driving device (refer 150 in FIG. 5), and the selection device (refer 160 in FIG. 5) may be completed. As illustrated in FIG. 10, on the front side of the semiconductor substrate 101 where the APS array (refer 10 in FIG. 1) is formed, multiple interlayer dielectric layers 210 and interconnection layers 220 may be formed. On the semiconductor substrate 101, the interlayer dielectric layer 210, which covers the APS array, may be formed, and then, the interconnection layer 220 on the interlayer dielectric layer 210 may be formed. In example embodiments, an etch stop layer (not shown) may be formed on the boundary of each interlayer dielectric layer 210.

For example, the interlayer dielectric layer 210 may be formed with a material having improved gap fill characteristics, and may be formed such that the top may be planarized. For example, HDP (High Density Plasma), TOSZ (Tonen SilaZene), SOG (Spin On Glass), or USG (Undoped Silica Glass) may be used to form the interlayer dielectric layer 210. The interconnection layer 220 may be formed by performing deposition of a conducting material on the interlayer dielectric layer 210, and patterning. For example, the conducting material may be composed of metal, e.g., copper and aluminum. The interconnection layers 220 formed on each interlayer dielectric layer 210 may be connected to lower devices and other interconnection layers 220 via contacts.

By forming the interlayer dielectric layer 210 and the interconnection layer 220 repeatedly one after the other, interconnections, which are electrically connected to an APS array (refer to 10 in FIG. 2), may be completed. Because electrical routing of each device of the APS array (refer to 10 in FIG. 2) and/or the arrangement of the interconnection layer 220 for shading function is modified in different ways, the descriptions may be skipped to avoid ambiguous interpretation of example embodiments. After forming multiple layers of the interlayer dielectric layer 210 and the interconnection layer 220, the interlayer dielectric layer 210, which covers the top interconnection layer 220, may be formed and planarized. The interlayer dielectric layer 210, which covers the top interconnection layer 220, may be a passivation layer. As a result, on the front side of the semiconductor substrate 101, devices for transfer and light signals may be completed.

Figure 11:
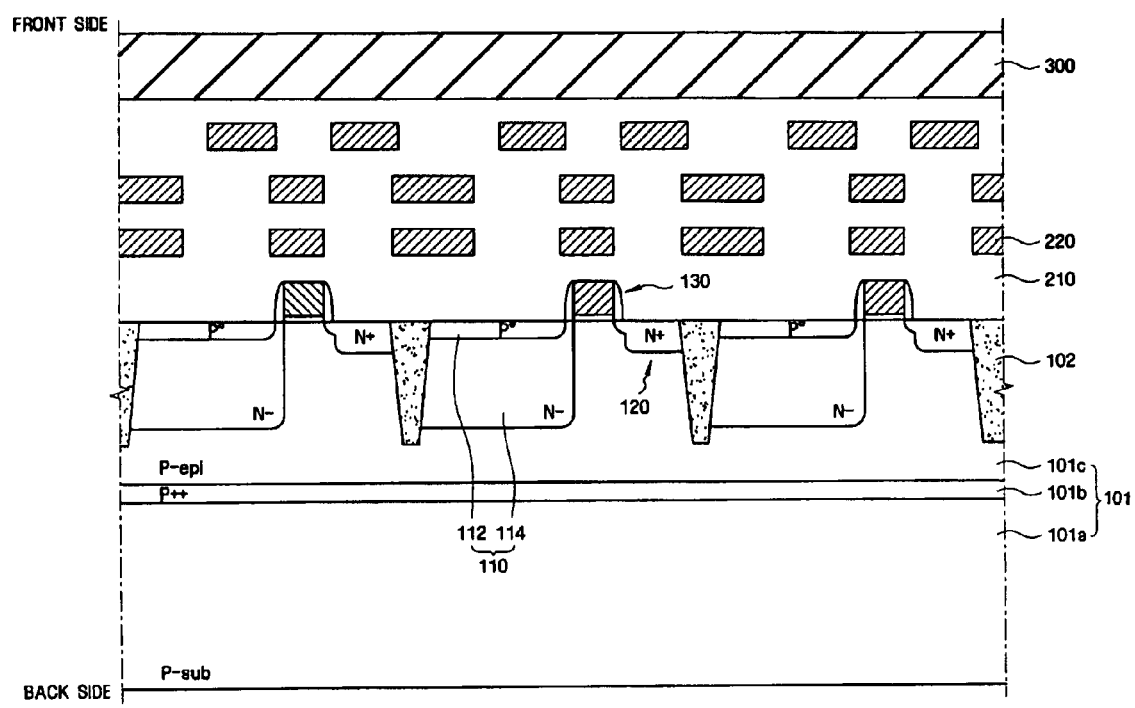
Figure 12:
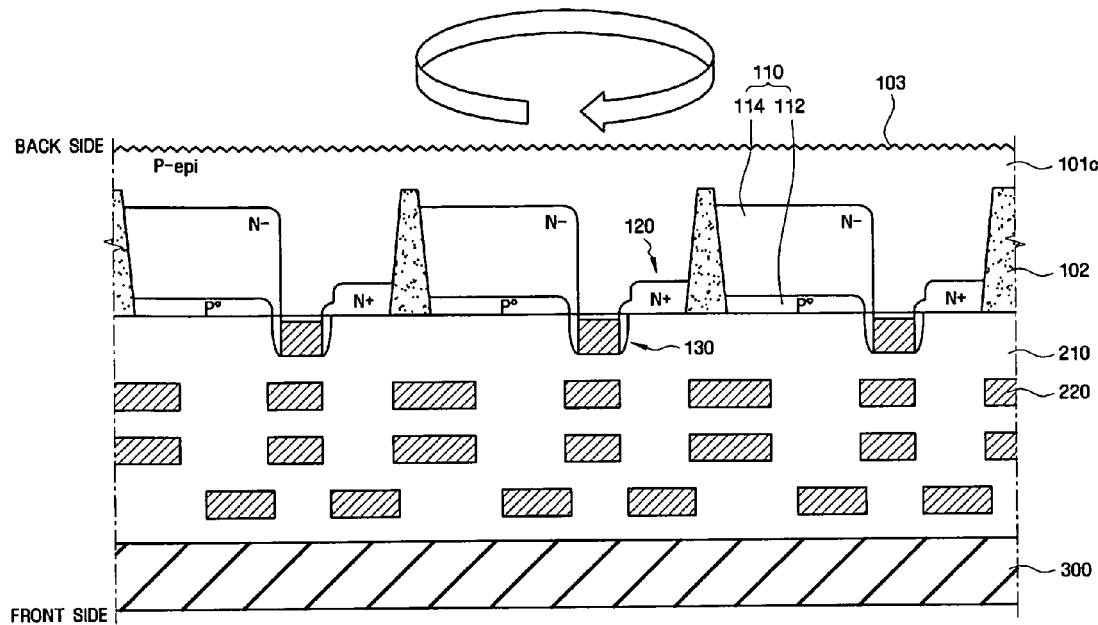

As illustrated in FIGS. 7 and 11, on the front side of the semiconductor substrate 101, where devices that transfer and read light signals are formed, a support layer 300 may be bonded (S200). On the top interlayer dielectric layer 210 where the top is planarized, the silicon support layer 300 may be formed. For example, by bonding a semiconductor substrate 300 on the top interlayer dielectric layer 210, the front side of the semiconductor substrate 101 may be supported. The top and bottom of the semiconductor substrate 101 may be reversed to grind the back side of the semiconductor substrate 101. By reversing the top and bottom of the semiconductor substrate 101, the light-receiving element 110 may be placed on the interconnection layers 220. As illustrated in FIG. 12, the semiconductor substrate 101 may be removed partially to reduce the thickness of the semiconductor substrate 101.

In example embodiments, by using a grinder or CMP equipment, the back side of the semiconductor substrate 101 may be grinded to remove part of the semiconductor substrate 101 mechanically (S300). In example embodiments, about several hundred micrometers of the semiconductor substrate 101 may be removed. Such mechanical removal may be performed on the P-type bulk substrate 101a of the semiconductor substrate 101. The thickness of the semiconductor substrate 101 may be minutely controlled by a chemical method to reduce the thickness of the semiconductor substrate 101 (S400). For example, by etching the back side of the semiconductor substrate 101 using wet etching, the thickness of the semiconductor substrate 101 may be reduced. Such wet etching processes may use a mixed solution of fluoric acid (HF), nitric acid ($HNO_3$), and acetic acid ($CH_3COOH$), and about several tens of micrometers may be reduced. Such a wet etching process may remove the P-type bulk substrate 101a and the high density P-type deep well 101b.

As described above, by performing grinding and etching processes, the semiconductor substrate 101 with a thickness of about 5 to about 10 μm may remain. As a result, from the semiconductor substrate 101 composed of the P-type bulk substrate 101a, the high density P-type deep well 101b, and the P-type epitaxial layer 101c, the P-type bulk substrate 101a and the high density P-type deep well 101b may be removed and only the P-type epitaxial layer 101c may remain. In example embodiments, the P-type epitaxial layer 101c may remain as the thickness of the semiconductor substrate 101 is reduced. However, in general, a substrate composed of silicon may be included. Thus, the P-type epitaxial layer 101b may be referred to as silicon substrate.

As described above, by reducing the thickness of the semiconductor substrate 101 by partially removing the semiconductor substrate 101, the path of light entering the light-receiving element 110 may be shortened. Thus, the photosensitivity of the light-receiving element 110 may be improved. When partially removing the semiconductor substrate 101 by performing grinding and etching processes, defects may be created on the surface of the semiconductor substrate due to a mechanical or chemical attack. For example, on a surface 103 of the P-type epitaxial layer 101c exposed by performing grinding and etching processes, fine defects may exist. Specifically, surface defects may be created on the back side of the silicon substrate 101c due to silicon dangling defects or etching stress.

As described above, defects created on the surface 103 of the silicon substrate 101c by a mechanical and chemical attack may cause a depletion well due to the electrical potential drop in the back side of the semiconductor substrate 101b when light enters the light-receiving element 110. The surface defects 103 of the silicon substrate 101c (the P-type epitaxial layer 101c) may create electrons or holes carriers and may provide a charge and hole recombination area. As a result, leakage current may be increased. Also, dark current, where electrons move in the lightless state, may be generated. Thus, the low illumination characteristics of a CMOS image sensor may be deteriorated.

After performing grinding of the semiconductor substrate 101, a thermal oxide layer or a CVD oxide layer may be formed on the surface of the P-type epitaxial layer 101c to remove the surface defects 103. However, when forming a heat oxide layer or a CVD oxide layer, the oxide fabrication process may be performed at a relatively high temperature and this may cause negative impacts on the devices 130 and interconnection layers 220 formed on the front side of the semiconductor substrate 101c. Thus, a surface treatment process using the chemical solution that consumes silicon in a relatively low temperature may be required to remove the surface defects 103 of the semiconductor substrate 101c without causing impacts on the devices 103 and the interconnection layers 220 formed on the front side of the semiconductor substrate 101c.

In example embodiments, after partially removing the semiconductor substrate 101, a surface treatment process may be performed to remove surface defects of the semiconductor substrate 101c, which may be the P-type epitaxial layer 101c (S500). The surface treatment process on the P-type epitaxial layer 101c may be described in detail in FIGS. 8, 12, and 13. The silicon substrate 101c having the surface defects 103 may be provided (S510). As illustrated in FIG. 11, during fabrication of an image device, the intermediate output after removing the back side of the semiconductor substrate 101 may be prepared. The fine defects 103 may exist on the exposed surface of the P-type epitaxial layer 101c. A chemical solution for surface treatment may be applied to an output having surface defects. More particularly, the output having surface defects may be dipped into a chemical bath containing the chemical solution for surface treatment (S520).

The chemical solution for surface treatment may be maintained at a relatively low temperature compared to a temperature used for other unit processes to minimize or reduce impacts on the devices, e.g., the light-receiving element 110, the charge transmission device 130, and the interconnection layer 220, already formed on the front side of the semiconductor substrate 101c. For example, the chemical solution in the chemical bath may be maintained at a temperature between about 80° C. and about 200° C. The chemical solution for surface treatment may be reacted to silicon atoms of the P-type epitaxial layer 101c, and may consume the P-type epitaxial layer 101c, e.g., the silicon substrate 101c. For example, a mixed solution SC-1 of $NH_4OH$, $H_2O_2$, and $H_2O$, mixed solution SC-2 of $HC_1$, $H_2O_2$, and $H_2O$, or DI water solution, which $O_3$ may be dissolved in (ozone water), may be used.

Also, the chemical solution for surface treatment may consume the P-type epitaxial layer 101c, and at the same time, the chemical oxide layer on the surface of the P-type epitaxial layer 101c may be created (S530). As described above, the intermediate output of the image device may be dipped into the chemical solution for surface treatment for about 5 to about 30 minutes. The dipping time of the intermediate output may vary, however, as the dipping time increases, the reaction between silicon and chemical solution may be decreased because silicon oxide may be continuously formed on the surface of the P-type epitaxial layer 101c. Therefore, after a certain period of time, the thickness of the chemical oxide layer 230 may be saturated with a certain value. The thickness of the chemical oxide layer 230 may be about 1 nm to about 10 nm.

As described above, the surface defects of the P-type epitaxial layer 101c may be removed by reaction between the chemical solution for surface treatment and the P-type epitaxial layer 101c. However, because dipping into the chemical solution only once cannot completely remove the surface defects, obtaining the P-type epitaxial layer 101c with an increased quality surface layer may not be achieved. After removing the chemical oxide layer formed by surface treatment, the intermediate output may be dipped into the chemical solution and the surface of the P-type epitaxial layer 101c may be consumed again. The chemical oxide layer 230 may be easily removed using fluoric acid (HF) solution. Dipping the intermediate output of the image sensor into the chemical solution for surface treatment may be repeated several times (S540). For example, the intermediate output may be dipped into the chemical solution about one to about five times.

Figure 13:
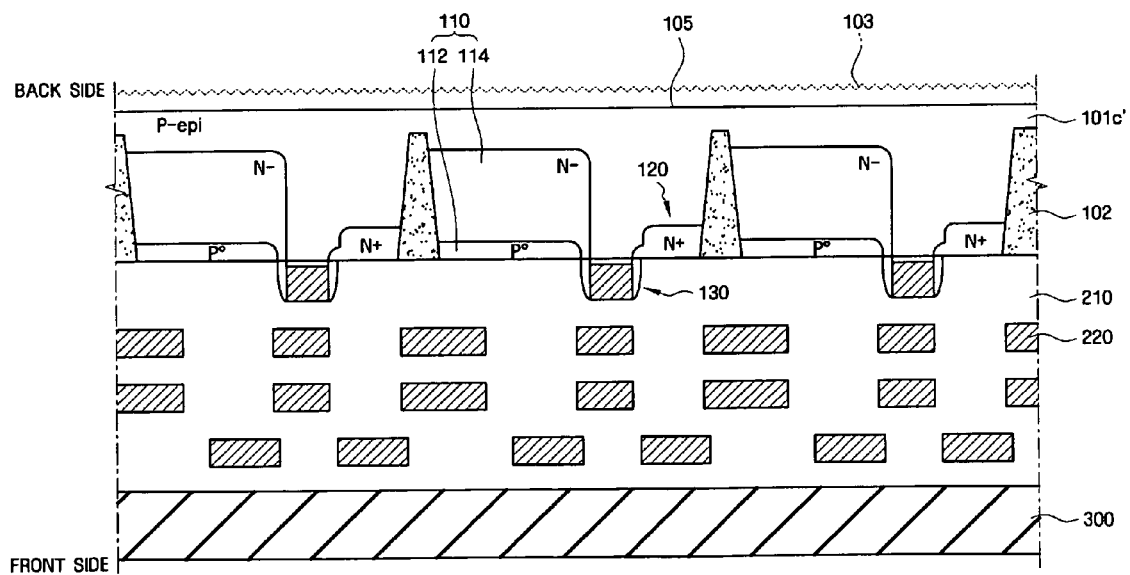
Figure 14:
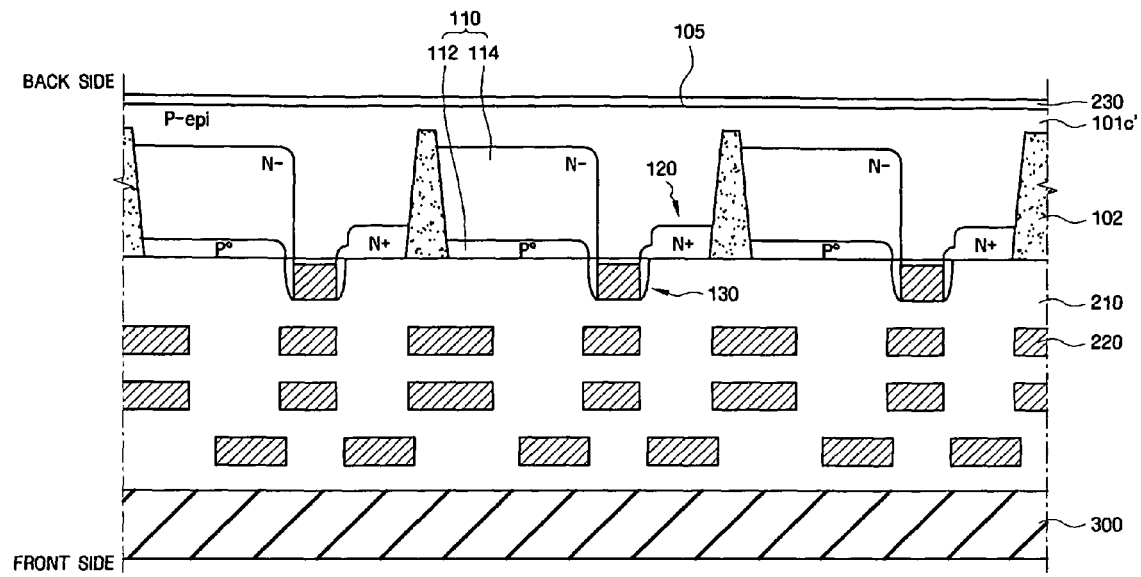

By performing dipping repeatedly, as illustrated in FIG. 13, the defects 103 created on the surface of the P-type epitaxial layer 101c may be removed, and the P-type epitaxial layer 101c' with an increased quality surface layer 105 may be obtained. During this process, the thickness of the P-type epitaxial layer 101c' may be reduced by about several nm. After repeating the chemical solution dipping several times, as illustrated in FIG. 14, the chemical oxide layer 230 may remain on the P-type epitaxial layer 101c' with an increased quality surface layer 105, and the surface treatment on the back side of the P-type epitaxial layer 101c' may be completed (S560).

Figure 15:
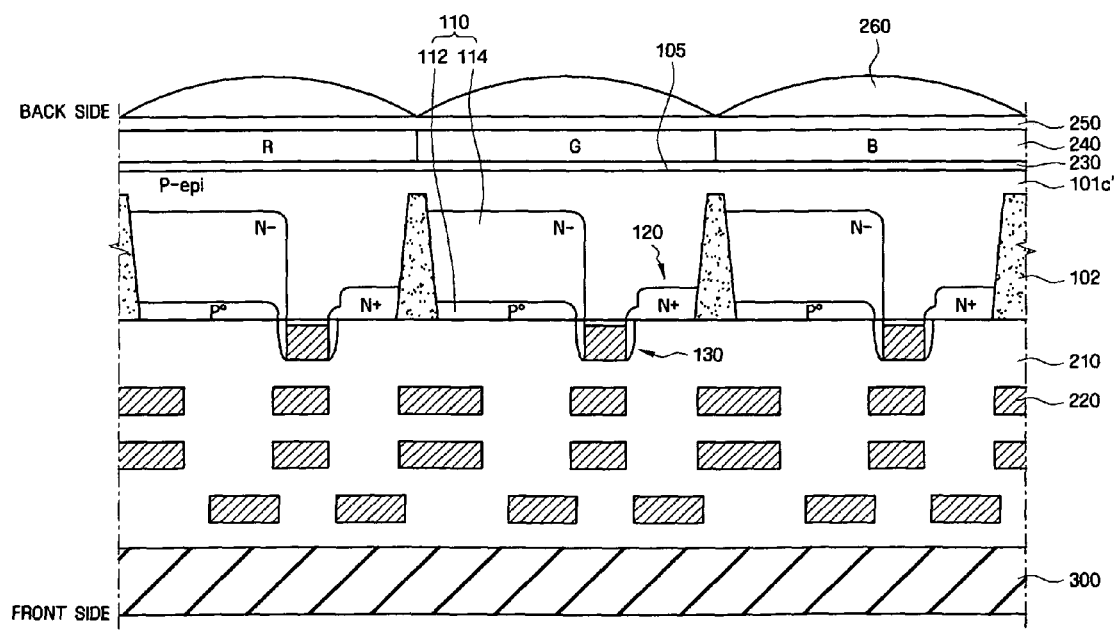

The chemical oxide layer 230 formed on the surface 105 of the P-type epitaxial layer 101c' may be used as an anti-reflection layer to prevent or reduce light entering into the back side while the surface defects 103 of the P-type epitaxial layer 101c are removed. Also, the chemical oxide layer 230 may act as a planarization layer. After removing the surface defects 103 of the P-type epitaxial layer 101c and forming the chemical oxide layer 230, as illustrated in FIG. 15, light penetration devices, which provide light entering the light-receiving element 110 including paths, may be formed on the chemical oxide 230.

In example embodiments, on the chemical oxide layer 230, a color filter layer 240, which corresponds to each of the light-receiving elements 110, may be formed. To obtain higher quality images, the color filter layer 240 may allow light of a particular color to penetrate the color filter layer 240 and to arrive at the light-receiving element 110 of the semiconductor substrate 101b. Methods to form such a color filter layer 240 may include a dyeing method, a pigment dispersing method, and a printing method. As a material to form such a color filter layer 240, a dyed photoresist may be mainly used, and the filter layer may be red, green, or blue. Therefore, a color filter may be located to correspond to each light-receiving element 110.

On the color filter layer 240, a planarization layer 250 may be formed using polyimide series or polyacryl series materials having improved light penetration characteristics. On the planarization layer 250, a micro-lens 260, which corresponds to each light-receiving element 110, may be formed. The micro-lens 260 may be formed by forming patterns that cover each light-receiving element 110 using a light penetration photoresist followed by reflow. As a result, the micro-lens 260 having a fixed curvature and a convex shape at the top may be formed. A follow up process to remove the remaining material on the surface of the micro-lens 260 may be performed. To maintain the shape of the micro-lens 260, a bake process may be performed.

As described above, when forming a back side illuminated image sensor according to example embodiments, to remove the surface defects after performing grinding the back side of the semiconductor substrate 101c', a chemical solution, which consumes silicon at a relatively low temperature, may be used for surface treatment. As a result, impacts on the devices 130 and interconnection layers 220 at a relatively high temperature may be prevented or reduced from forming on the front side when removing the surface defects on the back side of the semiconductor substrate 101c'. Therefore, deterioration of low illumination characteristics of an image sensor due to the surface defects on the back side of the semiconductor substrate 101c', for example the dark current increase, may be prevented or reduced. Also, damage to the devices 130 and the interconnection layers 220 formed on the front side of the semiconductor substrate 101c' and deterioration of the electrical characteristics caused by a process that removes the surface defects on the back side may be prevented or reduced.

While example embodiments have been particularly shown and described with reference to example embodiments thereof, it will be understood by those of ordinary skill in the art that various changes in form and details may be made therein without departing from the spirit and scope of example embodiments as defined by the following claims. Therefore, it may be to be understood that the above-described embodiments have been provided only in a descriptive sense and will not be construed as placing any limitation on the scope of example embodiments.

What is claimed is:

1. A treatment method for a surface of a substrate, comprising:
   providing a semiconductor substrate including a surface defect;
   providing a chemical solution to a surface of the semiconductor substrate;
   removing the surface defect by consuming the surface of the semiconductor substrate and forming a chemical oxide layer on the semiconductor substrate: and
   removing the chemical oxide layer,
   wherein providing the chemical solution, removing the surface defect and removing the chemical oxide layer are performed two or more times.

2. The method of claim 1, wherein the chemical solution is a solution selected from the group consisting of a mixed solution of $NH_4OH$, $H_2O_2$, and $H_2O$, a mixed solution of HCl, $H_2O_2$, and $H_2O$, and DI water solution including dissolved $O_3$.

3. The method of claim 1, wherein providing the chemical solution includes dipping the semiconductor substrate into the chemical solution at a temperature between about 80° C. and 200° C. for about 10 minutes to about 30 minutes.

4. The method of claim 1, wherein a thickness of the chemical oxide layer is about 1 nm to about 10 nm.

5. The method of claim 1, further comprising:
   removing the chemical oxide layer after forming the chemical oxide layer.

6. The method of claim 5, wherein removing the chemical oxide layer includes dipping the semiconductor substrate into HF solution.

7. The method of claim 1, wherein the semiconductor substrate is a silicon substrate.

8. A method of fabricating an image sensor, comprising:
providing a semiconductor substrate where a front side and a back side are defined;
forming a photoelectric transformation unit adjacent to the front side of the semiconductor substrate;
forming multiple interconnection layers on the front side of the semiconductor substrate;
reducing a thickness of the semiconductor substrate by removing a part of the back side of the semiconductor substrate;
performing the treatment method according to claim 1, wherein the surface defect is a back side defect, the back side of the semiconductor substrate is consumed, and the chemical oxide layer is formed on the back side of the semiconductor substrate; and
forming a color filter and a micro-lens on the back side of the semiconductor substrate to correspond to each of the phototransformation units.

9. The method of claim 8, wherein the semiconductor substrate includes a bulk substrate and an epitaxial layer.

10. The method of claim 9, wherein reducing the thickness of the semiconductor substrate includes removing the bulk substrate.

11. The method of claim 8, wherein reducing the thickness of the semiconductor substrate includes grinding and wet etching the back side of the semiconductor substrate.

12. The method of claim 8, wherein the chemical solution is a solution selected from the group consisting of a mixed solution of $NH_4OH$, $H_2O_2$ and $H_2O$, a mixed solution of HCl, $H_2O_2$ and $H_2O$, and DI water solution with dissolved $O_3$.

13. The method of claim 8, wherein providing the chemical solution includes dipping the semiconductor substrate into the chemical solution at a temperature between about 80° C. and 200° C. for about 10 minutes to about 30 minutes.

14. The method of claim 8, wherein removing the back side defect of the semiconductor substrate includes repeatedly forming the chemical oxide layer on the semiconductor substrate by dipping the semiconductor substrate into the chemical solution for surface treatment, which consumes the back side of the semiconductor substrate, and removing the chemical oxide layer one or more times.

15. The method of claim 14, wherein removing the chemical oxide layer includes dipping the semiconductor substrate into HF solution.

* * * * *